(12) United States Patent
Nishi et al.

(10) Patent No.: US 12,196,616 B2
(45) Date of Patent: Jan. 14, 2025

(54) INFLAMMABLE SPARK ESTIMATION SYSTEM

(71) Applicants: SUBARU CORPORATION, Tokyo (JP); Kyushu Institute of Technology, Fukuoka (JP)

(72) Inventors: Takayuki Nishi, Tokyo (JP); Shinya Ohtsuka, Fukuoka (JP)

(73) Assignees: SUBARU CORPORATION, Tokyo (JP); Kyushu Institute of Technology, Fukuoka (JP)

( * ) Notice: Subject to any disclaimer, the term of this patent is extended or adjusted under 35 U.S.C. 154(b) by 220 days.

(21) Appl. No.: 17/866,941

(22) Filed: Jul. 18, 2022

(65) Prior Publication Data
US 2022/0364921 A1 Nov. 17, 2022

Related U.S. Application Data

(63) Continuation of application No. PCT/JP2021/004818, filed on Feb. 9, 2021.

(30) Foreign Application Priority Data

Mar. 9, 2020 (JP) .................................. 2020-039977

(51) Int. Cl.
 *G01J 3/443* (2006.01)
 *G01J 3/02* (2006.01)
 (Continued)

(52) U.S. Cl.
 CPC ............. *G01J 3/443* (2013.01); *G01J 3/0205* (2013.01); *G01J 3/457* (2013.01); *G01J 2003/2859* (2013.01)

(58) Field of Classification Search
 CPC .......... G01J 3/443; G01J 3/0205; G01J 3/457; G01J 2003/2859; G01J 3/2803; G01J 3/28;
 (Continued)

(56) References Cited

U.S. PATENT DOCUMENTS

RE21,750 E * 3/1941 Starr ...................... F02M 69/00
 123/387
2,298,468 A * 10/1942 Curtis ...................... H01H 9/54
 361/10
(Continued)

FOREIGN PATENT DOCUMENTS

CN 1527931 A 9/2004
DE 10135704 A 2/2003
(Continued)

OTHER PUBLICATIONS

International Search Report issued in corresponding International Patent Application No. PCT/JP2021/004818, dated Apr. 6, 2021, with English translation.
(Continued)

*Primary Examiner* — Mohamed K Amara
(74) *Attorney, Agent, or Firm* — Rimon P.C.

(57) ABSTRACT

According to one implementation, an inflammable spark estimation system includes: a photodetector for measuring intensity of discharge light arising from a spark arising from a structural object made of a plurality of materials; and a data processing system configured to determine whether the spark has inflammability, based on the intensity of the discharge light measured by the photodetector, with referring to determination information. The determination information has been determined based on features of waveforms of wavelength spectra of possible discharge light arising from possible inflammable sparks respectively arising from possible materials of which the structural object may be
(Continued)

made. The data processing system is configured to further determine which of the plurality of the materials the spark has arisen from, based on the intensity of the discharge light measured by the photodetector, with referring to the determination information, when the spark has been determined to have the inflammability.

20 Claims, 5 Drawing Sheets

(51) Int. Cl.
*G01J 3/457* (2006.01)
*G01J 3/28* (2006.01)

(58) Field of Classification Search
CPC ............ G01J 2003/1213; G01N 21/67; G01R 31/1218; G01R 31/1227
See application file for complete search history.

(56) References Cited

U.S. PATENT DOCUMENTS

| | | | | |
|---|---|---|---|---|
| 2,975,278 | A * | 3/1961 | Brubaker | H01J 49/14 |
| | | | | 250/300 |
| 3,487,677 | A * | 1/1970 | Molitor | G21F 7/015 |
| | | | | 73/40.7 |
| 4,255,051 | A * | 3/1981 | Imamura | G01J 3/36 |
| | | | | 356/306 |
| 4,898,466 | A | 2/1990 | Fukui et al. | |
| 5,061,026 | A | 10/1991 | Clarke et al. | |
| 5,408,326 | A | 4/1995 | Wang | |
| 5,544,693 | A | 8/1996 | Begin et al. | |
| 6,064,064 | A * | 5/2000 | Castleman | G08B 29/24 |
| | | | | 250/339.05 |
| 6,515,283 | B1 * | 2/2003 | Castleman | G08B 17/12 |
| | | | | 340/578 |
| 6,634,598 | B2 * | 10/2003 | Susko | B64D 37/32 |
| | | | | 244/135 R |
| 6,750,597 | B1 | 6/2004 | Sakura | |
| 7,385,692 | B1 * | 6/2008 | Nguyen | G01J 3/28 |
| | | | | 356/301 |
| 7,420,662 | B2 * | 9/2008 | Yalin | G01N 21/718 |
| | | | | 356/317 |
| 7,899,608 | B1 * | 3/2011 | Pederson | G01M 15/11 |
| | | | | 701/111 |
| 9,036,146 | B2 | 5/2015 | Day | |
| 9,243,956 | B2 | 1/2016 | Day | |
| 9,267,842 | B2 | 2/2016 | Day | |
| 9,360,367 | B2 | 6/2016 | Day et al. | |
| 9,435,742 | B2 | 9/2016 | Day | |
| 9,442,154 | B2 | 9/2016 | Ohtsuka et al. | |
| 9,565,419 | B2 | 2/2017 | Presler | |
| 9,939,383 | B2 | 4/2018 | Day | |
| 9,952,100 | B2 | 4/2018 | Day et al. | |
| 9,977,069 | B2 * | 5/2018 | Ohtsuka | G01R 31/1218 |
| 9,998,692 | B1 * | 6/2018 | Griffiths | H04N 17/002 |
| 10,412,348 | B2 * | 9/2019 | Pool | H04N 23/651 |
| 10,545,051 | B2 | 1/2020 | Nishi | |
| 10,996,103 | B2 | 5/2021 | Nishi et al. | |
| 2002/0126278 | A1 | 6/2002 | Olshausen | |
| 2002/0101547 | A1 | 8/2002 | Lee et al. | |
| 2003/0174325 | A1 | 9/2003 | Zhang et al. | |
| 2004/0079905 | A1 | 4/2004 | Robb | |
| 2004/0113055 | A1 | 6/2004 | Whelan et al. | |
| 2004/0252305 | A1 | 12/2004 | Schacked | |
| 2005/0140974 | A1 | 6/2005 | Irie et al. | |
| 2006/0059922 | A1 | 3/2006 | Anderson et al. | |
| 2007/0258090 | A1 | 11/2007 | Kwon et al. | |
| 2008/0022694 | A1 | 1/2008 | Anderson et al. | |
| 2008/0212074 | A1 | 9/2008 | Goulter et al. | |
| 2009/0189773 | A1 | 7/2009 | Hansen et al. | |
| 2009/0294300 | A1 | 12/2009 | Kanzius | |
| 2010/0034349 | A1 | 2/2010 | Kraus et al. | |
| 2010/0181387 | A1 | 7/2010 | Zaffaroni et al. | |
| 2011/0228269 | A1 | 9/2011 | Vincent et al. | |
| 2014/0141679 | A1 | 5/2014 | Kyuno | |
| 2014/0368818 | A1 | 12/2014 | Demarco et al. | |
| 2015/0054514 | A1 * | 2/2015 | Hiraoka | F02P 17/12 |
| | | | | 324/393 |
| 2016/0018459 | A1 | 1/2016 | Ohtsuka et al. | |
| 2016/0313291 | A1 | 10/2016 | Johansen et al. | |
| 2016/0320361 | A1 | 11/2016 | Johansen et al. | |
| 2017/0059410 | A1 * | 3/2017 | Nishi | G01J 3/443 |
| 2017/0284862 | A1 | 10/2017 | Nishi et al. | |
| 2022/0364921 | A1 * | 11/2022 | Nishi | G01J 3/0205 |

FOREIGN PATENT DOCUMENTS

| | | | |
|---|---|---|---|
| EP | 0 318 900 | A2 | 6/1989 |
| EP | 1 409 972 | B1 | 6/2007 |
| EP | 3 144 649 | A1 | 3/2017 |
| EP | 3 226 217 | A2 | 10/2017 |
| JP | 2004-003988 | A | 1/2004 |
| JP | 2013-152155 | A | 8/2013 |
| JP | 2014-137227 | A | 7/2014 |
| JP | 2014-153298 | A | 8/2014 |
| JP | 2017-049025 | A | 3/2017 |
| JP | 2017-181332 | A | 10/2017 |
| WO | 2003/012381 | A1 | 2/2003 |

OTHER PUBLICATIONS

Takashi Miura, "Relationship between electrostatic energy and an emission spectrum in an equal electric field spark—Development of an ignition ability estimation method of an electrostatic spark by non-contact light measurement-", National Institute of Occupational Safety and Health, Japan, Special research report of National Institute of Occupational Safety and Health, Japan JNIOSH-SRR-No. 47 (2017), p. 75-81, with English machine translation.
Japanese Office Action dated Jun. 4, 2019. in Japanese Patent Application No. 2015-170339 with English machine translation.
European Search Report dated Feb. 22, 2017 in European Patent Application No. 16185099.5.
European Office Action dated May 25, 2021 in European Patent Application No. 16185099.5.
US First Office Action dated Dec. 7, 2017 in U.S. Appl. No. 15/246,284.
US Second Office Action dated Apr. 18, 2018 in U.S. Appl. No. 15/246,284.
US First Advisory Action dated Jul. 18, 2018 in U.S. Appl. No. 15/246,284.
US Third Office Action dated Sep. 27, 2018 in U.S. Appl. No. 15/246,284.
US Fourth Office Action dated Jan. 10, 2019 in U.S. Appl. No. 15/246,284.
US Second Advisory Action dated Apr. 15, 2019 in U.S. Appl. No. 15/246,284.
US Fifth Office Action dated Jun. 7, 2019 in U.S. Appl. No. 15/246,284.
Extended European Search Report dated Feb. 27, 2024 of the corresponding European Patent Application No. 21767551.1.
Abe R. et al: "Estimation of Spark Ignition Phenomena on CFRP Specimen with a Fastener by a Novel Optical System in the Ignitable Mixture Test Method", International Conference on Lightning [AMP] Static Electricity (ICOLSE 2015), Jan. 1, 2015 (Jan. 1, 2015), pp. 62 (7.)-62 (7.), XP093130782, DOI: 10.1049/ic.2015.0209 ISBN: 978-1-78561-223-7.
Translation of the International Preliminary Report on Patentability and the Written Opinion of the International Search Authority issued in corresponding International Patent Application No. PCT/JP2021/004818, dated Apr. 6, 2021.
Notice of Reasons for Refusal received in corresponding in Japanese Patent Application No. 2020-039977, dated Feb. 20, 2024.

* cited by examiner

INFLAMMABLE SPARK ESTIMATION SYSTEM

CROSS REFERENCES TO RELATED APPLICATIONS

This is a continuation of Application PCT/JP2021/004818, filed on Feb. 9, 2021.

This application is based upon and claims the benefit of priority from Japanese Patent Application No. 2020-039977, filed on Mar. 9, 2020; the entire contents of which are incorporated herein by reference.

FIELD

Implementations described herein relate generally to an inflammable spark estimation system and a method of estimating an inflammable spark.

BACKGROUND

Conventionally, observation tests of discharge light from a spark (spark discharge) have been conducted for an aircraft in order to avoid an explosion since static electricity and lightning strike may cause a spark in a fuel tank. A typical observation test of electric discharge in an aircraft is carried out by sending current to a test piece of a fuel tank which is not filled up with fuel and photographing the test piece by disposing many cameras and mirrors. When the current flowing in the test piece causes electric discharge, discharge light is photographed by the cameras. Thereby, when an examiner finds the discharge light by visual observation of the photographing results, a portion at which the electric discharge arose can be specified.

In such an observation test of a spark under a photographing method, a test piece is rejected as long as discharge light due to a spark is photographed even when the spark has too small energy to ignite aviation fuel. Therefore, an excess countermeasure may be required for preventing a spark from arising. Moreover, the photographing method has a problem that photographed discharge light may look different depending on a used camera.

Accordingly, a technique of estimating energy of discharge and a spark by measuring light intensity of the discharge light arising due to the spark with a light receiving element has been proposed (for example, refer to Japanese Patent Application Publication JPA 2014-137227 and Japanese Patent Application Publication JPA 2013-152155). Moreover, a technique of observing a wavelength spectrum of discharge light having arisen due to a spark, and determining whether the spark was explosive, that is, whether the spark was inflammable to aviation fuel or flammable gas, based on whether a peak appears in a specific wavelength band has also been proposed (for example, refer to Japanese Patent Application Publication JPA 2017-049025 and Japanese Patent Application Publication JPA 2017-181332).

In addition, research of investigating a relationship between electrostatic energy and an emission spectrum is also made in order to develop a method of estimating the ignition ability of a spark due to static electricity (for example, refer to Takashi MIURA, "Relationship between electrostatic energy and an emission spectrum in an equal electric field spark—Development of an ignition ability estimation method of an electrostatic spark by non-contact light measurement-", National Institute of Occupational Safety and Health, Japan, Special research report of National Institute of Occupational Safety and Health, Japan JNIOSH-SRR-No. 47 (2017), p. 75-81, searched on Mar. 26, 2019 through the internet<URL https://www.jniosh.johas.go.jp/publication/doc/srr/SRR-No47-2-2.pdf>).

A test piece of a fuel tank of an aircraft or the like for observation tests of electric discharge is sometimes made of different materials. As a concrete example, a metallic test piece is sometimes made of metals, such as aluminum, titanium and stainless steel. Meanwhile, a test piece may include at least one fiber reinforced plastic (FRP), such as glass fiber reinforced plastic (GFRP) and/or carbon fiber reinforced plastic (CFRP). There is also a test piece made by covering a part of CFRP with GFRP as well as a test piece made of both a metal and an FRP. Note that, an FRP is generally called a composite material.

Accordingly, an object of the present invention is to allow appropriately estimating whether a spark arising from a structural object made of a plurality of materials has inflammability.

SUMMARY OF THE INVENTION

In general, according to one implementation, an inflammable spark estimation system includes: a photodetector for measuring intensity of discharge light arising from a spark arising from a structural object made of a plurality of materials; and a data processing system configured to determine whether the spark has inflammability, based on the intensity of the discharge light measured by the photodetector, with referring to determination information. The determination information has been determined based on features of waveforms of wavelength spectra of possible discharge light arising from possible inflammable sparks respectively arising from possible materials of which the structural object may be made. The data processing system is configured to further determine which of the plurality of the materials the spark has arisen from, based on the intensity of the discharge light measured by the photodetector, with referring to the determination information, when the spark has been determined to have the inflammability.

Further, according to one implementation, a method of estimating an inflammable spark includes: determining whether the spark has the inflammability, using the above-mentioned inflammable spark estimation system; and determining which of the plurality of the materials the spark has arisen from when the spark has been determined to have the inflammability.

Further, according to one implementation, a method of estimating an inflammable spark includes: measuring intensity of discharge light arising from a spark arising from a structural object made of a plurality of materials, by a photodetector; and determining whether the spark has inflammability, based on the intensity of the discharge light measured by the photodetector, with referring to determination information. The determination information has been determined based on features of waveforms of wavelength spectra of possible discharge light arising from possible inflammable sparks respectively arising from possible materials of which the structural object may be made. Which of the plurality of the materials the spark has arisen from is further determined, based on the intensity of the discharge light measured by the photodetector, with referring to the determination information, when the spark has been determined to have the inflammability.

DETAILED DESCRIPTION

An inflammable spark estimation system and a method of estimating an inflammable spark according to implementations of the present invention will be described with reference to the accompanying drawings.

(First Implementation)
(Configuration and Function of Inflammable Spark Estimation System)

Figure 1:
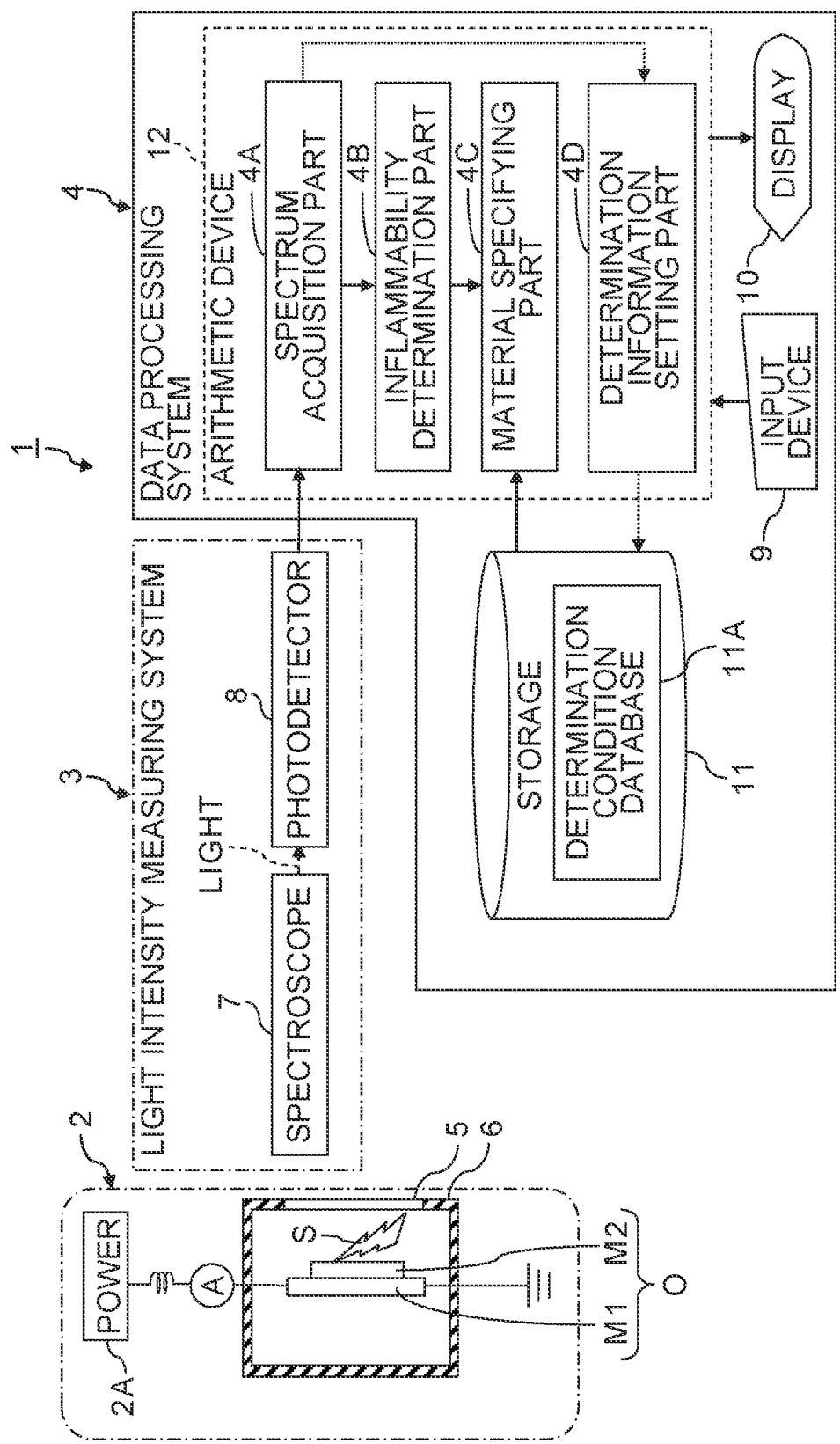
FIG. 1 shows a configuration of an inflammable spark estimation system according to the first implementation of the present invention.

FIG. 1 shows a configuration of an inflammable spark estimation system according to the first implementation of the present invention.

An inflammable spark estimation system 1 determines whether a spark S having arisen from a structural object O made of materials has inflammability, that is, whether the spark S has a property of igniting and exploding inflammable material, such as aviation fuel or inflammable gas. In addition, when the spark S having arisen from the structural object O is determined to have inflammability, the inflammable spark estimation system 1 further determines from which material out of the materials included in the structural object O the spark S having arisen from the structural object O has arisen. For that purpose, the inflammable spark estimation system 1 has a current application circuit 2, a light intensity measuring system 3 and a data processing system 4.

The structural object O, which is a test target of the spark S, can be an object, such as a test piece simulating a fuel tank of an aircraft, having desired structure and made of desired materials. In an example shown in FIG. 1, the structural object O made by overlapping a first material M1 with a second material M2 is placed in a darkroom 6 having a window 5.

When an aircraft structural object is the structural object O to be tested, the inflammability of the spark S which arose in the structural object O made of at least one composite material, such as CFRP and/or GFRP, as well as at least one metal, such as aluminum, titanium and/or stainless steel, can be estimated. That is, the inflammability of the spark S can be determined and a material from which the spark S having the inflammability arose can be specified by targeting the structural object O made of materials including a metal and/or a composite material.

The spark S is classified into a voltage spark generated caused by a difference of electrical potential and a thermal spark generated caused by accumulated heat. In case of an aircraft structural object, a voltage spark mainly arises caused by a potential difference due to static electricity or lightning. Meanwhile, a thermal spark arises caused by heat accumulated in a composite material. A thermal spark or a voltage spark arising due to an increase in electric charge in an end portion of a composite material is called an edge glow.

In case of an aircraft structural object, the possibility that the spark S may arise is high around a composite material and in a case where an insulator, such as air, insulating paint, resin or GFRP, intervenes between conductors, such as a metal and carbon included in CFRP. In case of an aircraft structural object, ignition of an inflammable material, such as aviation fuel or flammable gas, due to generation of the spark S leads to a big accident. Therefore, it is important to carry out tests and estimate whether the spark S has inflammability in addition to whether the spark S arises. When the spark S having inflammability arose, specifying from which material the spark S arose allows promptly determining a portion and/or a component of the structural object O whose design should be changed in order to prevent the spark S having inflammability from arising.

The current application circuit 2 applies current to the structural object O. The current application circuit 2 can be composed of a power 2A, a current measuring instrument for measuring a waveform of current applied to the structural object O, and at least one circuit element, such as a resistance and a capacitor, necessary for adjusting application conditions of the current. When predetermined current is applied to the structural object O by the current application circuit 2, electrostatic discharge arising from the structural object O and lightening to the structural object O can be simulated. Accordingly, it can be confirmed whether the spark S arises from the structural object O when static electricity or current corresponding to lightning current is applied to the structural object O.

The light intensity measuring system 3 measures intensity of discharge light generated by the spark S which arose from the structural object O. The light intensity measuring system 3 can be composed of a photodetector 8 with a spectroscope 7 disposed before the photodetector 8 as exemplified by FIG. 1. The spectroscope 7 is an optical device for inputting and dispersing discharge light generated by the spark S which arose from the structural object O. Therefore, the spectroscope 7 is disposed at such a position that discharge light generated by the spark S which arose from the structural object O can enter. The photodetector 8 detects intensities of discharge light corresponding to wavelengths dispersed by the spectroscope 7. Note that, a unit composed of the spectroscope 7 and the photodetector 8 may be called a spectrometer.

Concrete examples of the photodetector 8 disposed at the rear stage of the spectroscope 7 include a Photomultiplier tube (PMT) and a light receiving element, such as, a Charged-coupled device (CCD) sensor and a Complementary Metal Oxide Semiconductor (CMOS) sensor.

Note that, one end of an optical fiber may be disposed for incidence of light at a position where discharge light from the spark S generated in the structural object O can enter while the spectroscope 7 may be coupled to the other end of the optical fiber. In this case, the spectroscope 7 can be placed at a desired position. Accordingly, it also becomes possible to dispose the spectroscope 7 in a shield box placed at a position away from the structural object O in order to suppress noise.

The light intensity measuring system 3 configured as mentioned above can measure intensity of discharge light generated by the spark S, which arose from the structural object O, for each wavelength by the photodetector 8. The output side of the photodetector 8 is coupled to the data processing system 4. Therefore, the intensity of discharge light measured by the photodetector 8 is output to the data processing system 4.

The data processing system 4 determines not only whether the spark S having arisen from the structural object O has inflammability, but from which material out of materials included in the structural object O the spark S having arisen from the structural object O arose in a case where it is determined that the spark S having arisen from the structural object O has inflammability, based on intensity of discharge light for each wavelength measured in the light intensity measuring system 3.

The data processing system 4 can be composed of a computer into which a data processing program has been installed. That is, the data processing system 4 can be composed of processing circuitry consisting of a single electronic circuit or electronic circuits. When an electric signal indicating intensity of discharge light output from the light intensity measuring system 3 is analog, the data processing system 4 can include an A/D (analog-to-digital) converter so that a digital signal can be processed.

The data processing system 4 has an input device 9, a display 10, storage 11 and an arithmetic device 12. The arithmetic device 12 functions as a spectrum acquisition part 4A, an inflammability determination part 4B, a material specifying part 4C and a determination information setting part 4D by reading the data processing program.

The spectrum acquisition part 4A has a function to input detection signals of light intensities corresponding to respective wavelengths from the photodetector 8 and acquire a wavelength spectrum of discharge light corresponding to the spark S. The inflammability determination part 4B has a function to determine whether the spark S which arose from the structural object O is inflammable, based on the wavelength spectrum of the discharge light and determination information stored in the storage 11. The material specifying part 4C has a function to specify a material from which the spark S having inflammability arose, based on determination information stored in the storage 11, in a case where the spark S which arose from the structural object O is determined to have inflammability.

Figure 2:
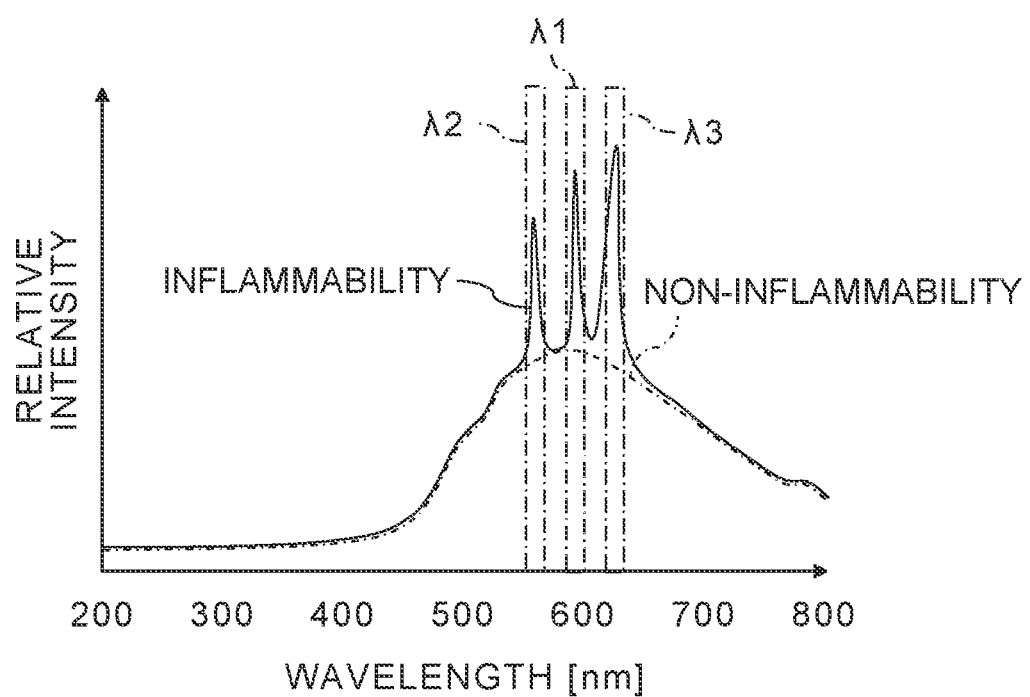
FIG. 2 shows an example of a wavelength spectrum of light measured by dispersing discharge light from a spark, which arose from a structural object made of CFRP, by the spectroscope.

FIG. 2 shows an example of a wavelength spectrum of light measured by dispersing discharge light from a spark S, which arose from a structural object O made of CFRP, by the spectroscope 7.

In FIG. 2, the horizontal axis denotes the wavelength of the discharge light while the vertical axis denotes the relative intensity of the discharge light. The relationship between waveforms of wavelength spectra of discharge light arising from the sparks S and whether each of the sparks S having arisen from CFRP had inflammability was investigated by tests. As a result, it became clear that at least one peak appeared in specific wavelength bands $\lambda 1$, $\lambda 2$, and $\lambda 3$ of a wavelength spectrum of light as shown in FIG. 2 when the spark S having arisen from CFRP had a property of igniting inflammable material, such as fuel. That is, a relationship that the spark S having arisen from CFRP is inflammable when at least one peak appears in the specific wavelength bands $\lambda 1$, $\lambda 2$, and $\lambda 3$ of a wavelength spectrum of light was experientially confirmed.

Similarly, the relationship between waveforms of wavelength spectra of discharge light from the sparks S having arisen from the structural object O made of another material, such as GFRP, aluminum, or titanium, and whether each of the sparks S having arisen from the structural object O had inflammability was investigated by tests. As a result, it became clear that at least one peak appeared in the same wavelength bands $\lambda 1$, $\lambda 2$, and $\lambda 3$ in a wavelength spectrum of discharge light having arisen from the spark S regardless of material as long as the spark S had inflammability.

More specifically, a relationship that the spark S had inflammability regardless of material from which the spark S arose as long as a peak was observed in a wavelength spectrum in at least one of the first wavelength band $\lambda 1$ of not less than 588 nm and not more than 591 nm, the second wavelength band $\lambda 2$ of not less than 552 nm and not more than 555 nm, and the third wavelength band $\lambda 3$ of not less than 619 nm and not more than 623 nm was confirmed. It is considered that the number of the peaks in a wavelength spectrum of discharge light observed when the spark S has inflammability changes according to energy of the discharge light. FIG. 2 shows an example in which peaks were observed in all of the first wavelength band $\lambda 1$ of 588 nm to 591 nm, the second wavelength band $\lambda 2$ of 552 nm to 555 nm and the third wavelength band $\lambda 3$ of 619 nm to 623 nm.

Therefore, whether the spark S has inflammability can be determined by determining whether a peak appears in at least one of the first wavelength band $\lambda 1$, the second wavelength band $\lambda 2$, and the third wavelength band $\lambda 3$ in a wavelength spectrum of discharge light.

For that reason, information including the first wavelength band $\lambda 1$, the second wavelength band $\lambda 2$ and the third wavelength band $\lambda 3$ of a wavelength spectrum of discharge light as well as threshold values to peak intensities in a case where peaks appear in the respective wavelength bands $\lambda 1$, $\lambda 2$ and $\lambda 3$ can be stored in the storage 11 as determination information for determining the inflammability of the spark S. Meanwhile, the inflammability determination part 4B can be provided with a function to determine whether a peak appeared in at least one of the first wavelength band $\lambda 1$, the second wavelength band $\lambda 2$, and the third wavelength band $\lambda 3$ of a wavelength spectrum of discharge light, by known peak detection processing with reference to the determination information stored in the storage 11, and a function to determine whether the spark S has inflammability, based on the determination result of whether at least one peak appeared.

As a concrete example, respective upper limits of intensities which do not correspond to peaks in the specific wavelength bands $\lambda 1$, $\lambda 2$, and $\lambda 3$ consisting of the first wavelength band $\lambda 1$, the second wavelength band $\lambda 2$ and the third wavelength band $\lambda 3$ of a wavelength spectrum of discharge light arising from the spark S can be stored in the storage 11 as the determination information. In this case, the inflammability determination part 4B can determine that the spark S which arose from the structural object O has inflammability, in a case where any of intensities in the specific wavelength bands $\lambda 1$, $\lambda 2$, and $\lambda 3$ of discharge light detected by the photodetector 8 exceeds the corresponding upper limit stored as the determination information since such a case means a peak appeared.

The specific wavelength bands $\lambda 1$, $\lambda 2$, and $\lambda 3$ where at least one peak appears in a wavelength spectrum of discharge light when the spark S has inflammability are common among different materials while the waveform of a wavelength spectrum of discharge light differs for each material. That is, the waveform of a wavelength spectrum of discharge light is specific to a material. Therefore, observing the waveform of a wavelength spectrum of discharge light allows specifying a material from which the spark S arose, regardless of whether the spark S has inflammability. As a concrete example, when a peak specific to a certain material appears in a wavelength spectrum of discharge light, or conversely when a wavelength band, showing decreased intensity, specific to a certain material appears in a wavelength spectrum of discharge light, it can be determined that the spark S arose from the material.

Accordingly, features of waveforms of wavelength spectra of discharge light arising from the sparks S having inflammability arising from materials possibly included in the structural object O can be grasped by tests or the like, and determination information for specifying the material, from which the spark S arose, based on a feature of a waveform of a wavelength spectrum of discharge light can be determined.

Figure 3:
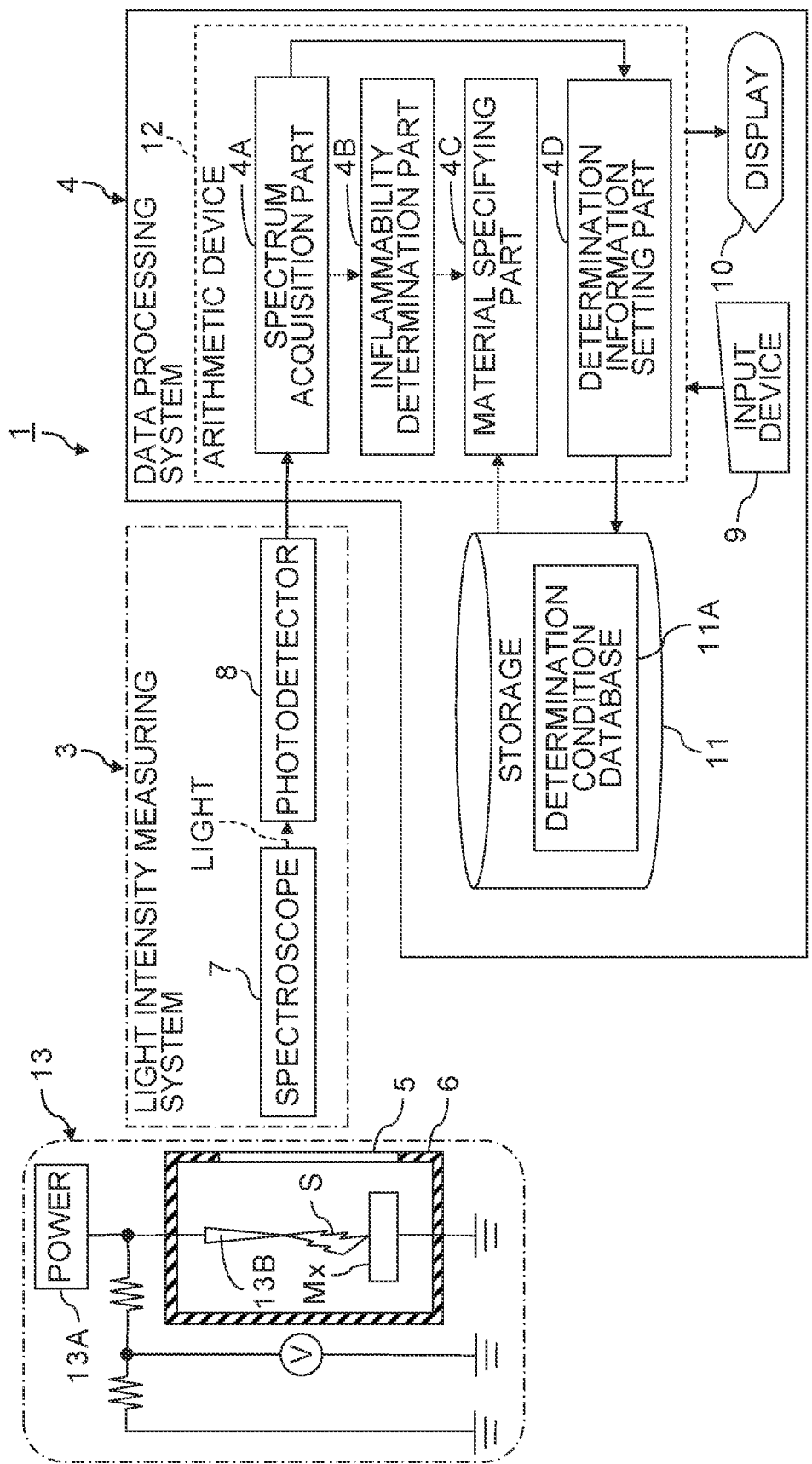
FIG. 3 shows an example of a method for observing a wavelength spectrum of discharge light for each material by the inflammable spark estimation system shown in FIG. 1.

FIG. 3 shows an example of a method for observing a wavelength spectrum of discharge light for each material by the inflammable spark estimation system 1 shown in FIG. 1.

When a wavelength spectrum of discharge light is observed for each material, a material Mx to be observed can be placed in the darkroom 6, such as a chamber, having the window 5 as shown in FIG. 3. Moreover, a voltage application circuit 13 having a direct current power 13A and a needle-like electrode 13B coupled to the direct current power 13A is placed, and the electrode 13B can be disposed close to the material Mx in a non-contact state while the material Mx can be grounded. Thereby, the spark S can be generated intentionally and forcibly by applying voltage between the electrode 13B and the material Mx by the direct current power 13A.

Thus, intensity of discharge light arising from the spark S generated from the material Mx can be detected for each wavelength by the photodetector 8 with the spectroscope 7 at the fore stage, and a wavelength spectrum of the discharge light corresponding to the material Mx can be acquired in the spectrum acquisition part 4A. Similarly, wavelength spectra of discharge light corresponding to the materials Mx including the first material M1 and the second material M2 can also be acquired.

The determination information setting part 4D has a function to set determination information for specifying a material, from which the spark S arose, based on features of waveforms of wavelength spectra of discharge light corresponding to materials, and a function to store the set determination information in the storage 11. Accordingly, the storage 11 functions as a determination condition database 11A storing not only determination information on inflammability of the spark S but determination information for specifying a material from which the spark S arose.

Moreover, the determination information setting part 4D is configured to display, on the display 10, information, such as a waveform or a peak detection result, on a wavelength spectrum for each material for setting determination information for specifying a material from which the spark S arose. Meanwhile, the determination information setting part 4D is also configured to input, by operation of the input device 9, information for setting determination information for specifying a material from which the spark S arose.

The determination information for specifying a material from which the spark S arose can be defined by index values representing features of waveforms of wavelength spectra of discharge light corresponding to materials possibly included in the structural object O. As a concrete example, a combination of a wavelength or a wavelength band at or in which a peak specific to a material appears, and peak intensity can be set as index values representing the feature of a waveform of a wavelength spectrum specific to the material. As another concrete example, when there is a wavelength band within which intensity remarkably attenuates in a wavelength spectrum of discharge light, a combination of the wavelength band and a threshold value to intensity of discharge light, or the like can be set as index values representing the feature of a waveform of a wavelength spectrum specific to a corresponding material. As a matter of course, a waveform itself of a wavelength spectrum of discharge light may be set as index values as well as at least one desired parameter, such as the number of peaks, a combination of the maximum value or the minimum value and a corresponding wavelength, or an integral value, may be set as an index value or index values.

Therefore, the determination information setting part 4D is provided with a function to relate an index value or index values, such as a waveform itself of a wavelength spectrum of discharge light, or a combination of a peak value and a peak wavelength, representing a feature of a waveform of a wavelength spectrum, to identification information on a material, and a function to write the index value or index values, related to the identification information on the material, into the storage 11 as determination information when the wavelength spectrum of the discharge light corresponding to the material has been acquired under the observation method as exemplified by FIG. 3.

When such determination information including index values is stored in the storage 11, the material specifying part 4C can refer to the determination information stored in the storage 11 in a case where the spark S having arisen from the structural object O is determined to have inflammability, and thereby can determine which material out of materials included in the structural object O the spark S having arisen from the structural object O arose from, based on degree of coincidence between at least one index value included in the determination information and at least one index value representing a feature of a waveform of a wavelength spectrum of discharge light acquired based on intensity of the discharge light detected by the photodetector 8.

As a concrete example, when waveforms themselves of wavelength spectra of discharge light corresponding to materials respectively are stored as determination information in the storage 11, which material the spark S having arisen from the structural object O to be estimated arose from can be specified by comparing a waveform of a wavelength spectrum of discharge light from the spark S having arisen from the structural object O with each of the waveforms of the wavelength spectra of the discharge light stored in the storage 11. The degree of coincidence between the waveforms can be estimated by an index value, such as a square error or a cross-correlation value.

As another concrete example, when a combination of a peak wavelength and a lower limit of a peak value in a wavelength spectrum of discharge light is stored as determination information on a certain material in the storage 11, it can be determined that the spark S arose from the material in a case where a peak whose value was not less than the lower limit was detected at the same peak wavelength in a wavelength spectrum of discharge light from the spark S having arisen from the structural object O to be estimated.

Figure 4:
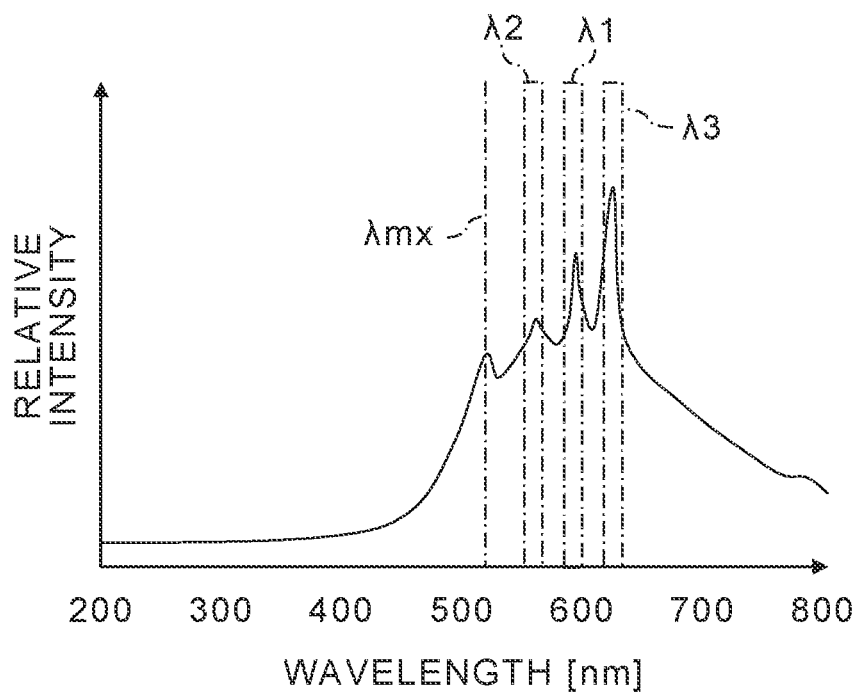
FIG. 4 shows an example of a waveform of a wavelength spectrum of discharge light from a spark which arose from a certain material.

FIG. 4 shows an example of a waveform of a wavelength spectrum of discharge light from a spark S which arose from a certain material Mx.

In FIG. 4, the horizontal axis denotes the wavelength of discharge light while the vertical axis denotes the relative intensity of the discharge light. When a wavelength spectrum of discharge light having a waveform as exemplified by FIG. 4 was observed, for example, it can be determined whether the spark S has inflammability by detecting the existence of a peak in each of the first to third specific wavelength bands $\lambda 1$, $\lambda 2$ and $\lambda 3$.

In the example shown in FIG. 4, remarkable peaks has appeared in the first wavelength band $\lambda 1$ of 588 nm to 591 nm and the third wavelength band $\lambda 3$ of 619 nm to 623 nm while a peak whose intensity is small has appeared in the second wavelength band $\lambda 2$ of 552 nm to 555 nm. Therefore, as long as respective upper limits of intensity of discharge light in the first to third specific wavelength bands $\lambda 1$, $\lambda 2$ and $\lambda 3$ for determining that the spark S is non-flammable are each set appropriately, the spark S can be determined to have inflammability even if intensity of the discharge light in the second wavelength band $\lambda 2$ is not more than the upper limit set to the second wavelength band $\lambda 2$ since at least one of intensities of the discharge light in the first wavelength band $\lambda 1$ and the third wavelength band $\lambda 3$ exceeds a corresponding one of the upper limits respectively set to the first wavelength band $\lambda 1$ and the third wavelength band $\lambda 3$.

When the spark S has been determined to be inflammable, the material Mx from which the spark S arose can be specified based on determination information stored in the storage 11. In the example shown in FIG. 4, a peak specific to the material Mx has appeared in a wavelength band different from any of the first to third specific wavelength bands $\lambda 1$, $\lambda 2$ and $\lambda 3$, concretely, at a wavelength $\lambda mx$ much lower than the second wavelength band $\lambda 2$.

Therefore, when a waveform itself of a wavelength spectrum of discharge light having arisen from the material Mx is stored as determination information in the storage 11, the material Mx from which the spark S arose can be specified by comparison of waveforms in wavelength bands other than the first to third specific wavelength bands $\lambda 1$, $\lambda 2$ and $\lambda 3$. Alternatively, when a combination of the wavelength $\lambda mx$ and a lower limit of peak intensity is related with the material Mx, and stored as determination information in the storage 11, the material Mx from which the spark S arose can be specified by detecting a peak at the wavelength $\lambda mx$ from a wavelength spectrum of discharge light as exemplified by FIG. 4.

The determination result of the existence of inflammability of the spark S determined automatically in the inflammability determination part 4B can be displayed on the display 10 so that a user can check. Similarly, the material Mx specified automatically in the material specifying part 4C when the spark S has been determined to have inflammability can also be displayed on the display 10 so that a user can check.

Note that, a user may visually determine whether the spark S has inflammability and specify a material from which the spark S arose, instead of automatic data processing in the inflammability determination part 4B and the material specifying part 4C. When a user visually determines inflammability of the spark S, the inflammability determination part 4B has only to perform processing for displaying a waveform of a wavelength spectrum of discharge light acquired in the spectrum acquisition part 4A on the display 10. Meanwhile, when a user visually specifies a material from which the spark S arose, the material specifying part 4C has only to perform processing for parallel display, superposition display or switching display of determination information, such as waveforms of wavelength spectra of discharge light corresponding to materials, on the display 10.

Thereby, a user can observe a waveform of a wavelength spectrum of discharge light displayed on the display 10 to determine whether the spark S has inflammability based on the existence of at least one peak. Specifically, when a peak is observed in at least one of the first to third specific wavelength bands $\lambda 1$, $\lambda 2$ and $\lambda 3$ of a wavelength spectrum of discharge light, the spark S which arose from the structural object O can be determined to have inflammability.

Conversely, when no peak is observed in any of the first to third specific wavelength bands $\lambda 1$, $\lambda 2$ and $\lambda 3$ of a wavelength spectrum of discharge light, it can be determined that the spark S which arose from the structural object O does not have inflammability.

In addition, a material from which the spark S arose can be specified by visual comparison between a waveform of a wavelength spectrum of discharge light and each of reference waveforms corresponding to materials or the like, which are displayed in parallel on the display 10. Specifically, it can be determined that the spark S arose from a material corresponding to a reference waveform which a waveform of a wavelength spectrum of observed discharge light resembles most.

By the way, when the first material M1 is overlapped with the second material M2 as exemplified by FIG. 1 as well as the second material M2 is transparent to discharge light, discharge light from the spark S arising from the first material M1 is observed by the light intensity measuring system 3 after being transmitted through the second material M2. That is, there is a case that the spark S arises inside the structural object O and discharge light transmitted through the structural object O is observed from the outside.

When the spark S itself is not discharged out to space but only discharge light propagates through space as described above, it is often appropriate to determine, in a discharge verification test, that there is no risk of ignition even when the spark S has energy necessary for ignition. Nevertheless, when the spark S has large energy, discharge light transmitted through the second material M2 may be observed by the light intensity measuring system 3 and at least on peak representing inflammability may appear in a wavelength spectrum of the discharge light.

For that reason, the inflammability determination part 4B can be provided with a function to determine that the spark S has no inflammability when discharge light is light transmitted through the second material M2. In that case, it is necessary to determine whether discharge light was transmitted through the second material M2. Examples of a method for determining whether discharge light was transmitted through the second material M2 include a method of utilizing decrease in peak intensity of a wavelength spectrum of the discharge light resulting from transmission through the second material M2, and a method of utilizing waveform change of a wavelength spectrum of the discharge light resulting from transmission through the second material M2.

The method of utilizing decrease in peak intensity of a wavelength spectrum of discharge light resulting from transmission through the second material M2 is a method of distinguishing, by threshold processing, peak intensity which appears in at least one of the specific first to third wavelength bands $\lambda 1$, $\lambda 2$ and $\lambda 3$ in a wavelength spectrum of discharge light from the inflammable spark S having arisen from the first material M1 in a case where the discharge light was transmitted through the second material M2, from peak intensity which appears in at least one of the specific first to third wavelength bands λ1, λ2 and λ3 in a wavelength spectrum of discharge light from the inflammable spark S having arisen from the first material M1 in a case where the discharge light was not transmitted through the second material M2.

That is, when discharge light is transmitted through the second material M2, intensity of the discharge light decreases by amount according to the transmittance of the second material M2, compared to that before the transmission through the second material M2. Therefore, peak intensities in the first to third specific wavelength bands λ1, λ2 and λ3 of a wavelength spectrum of discharge light transmitted through the second material M2 from the inflammable spark S decrease compared to those in a case where the discharge light is discharged from the first material M1 to space.

For that reason, respective upper limits of peak intensities of discharge light in the first to third specific wavelength bands λ1, λ2 and λ3 for determining that the spark S is nonflammable, which are stored in the storage 11 as determination information, can be respectively determined as values larger than intensities in the specific wavelength bands λ1, λ2 and λ3 of transmitted light whose intensity has been attenuated, generated in a case where discharge light arises from the spark S, which has inflammability if the spark S is discharged to space, having arisen from the first material M1 possibly included in the structural object O, and is transmitted through the second material M2 with intensity attenuation. Meanwhile, the respective upper limits of peak intensities of discharge light in the first to third specific wavelength bands λ1, λ2 and λ3 can be respectively determined as values smaller than intensities in the specific wavelength bands λ1, λ2 and λ3 of the discharge light before the intensity attenuation due to transmission through the second material M2. These respective upper limits of peak intensities of discharge light in the first to third specific wavelength bands λ1, λ2 and λ3 can be determined by discharge tests in which the first material M1 is actually overlapped with the second material M2 as exemplified by FIG. 1.

In this case, intensity of discharge light from the first material M1, which have attenuated due to transmission through the second material M2, become not more than the upper limit in any of the first to third specific wavelength bands λ1, λ2 and λ3, and therefore the spark S can be determined as nonflammable. Meanwhile, intensity of light discharged from the first material M1 to space without transmission through the second material M2 exceeds the upper limit in at least one of the first to third specific wavelength bands λ1, λ2 and λ3 as long as the spark S has inflammability, and therefore the spark S can be determined as inflammable.

On the other hand, a method of utilizing waveform change of a wavelength spectrum of discharge light from the first material M1, resulting from transmission through the second material M2 is carried out by detecting variation of intensity of discharge light in at least one wavelength band other than any of the first to third specific wavelength bands λ1, λ2 and λ3. When discharge light having arisen from the first material M1 is transmitted through the second material M2, intensity decreases in at least one wavelength band specific to the second material M2 in some cases. As a concrete example, when the second material M2 is glass, intensity of discharge light remarkably decreases in the wavelength band of near infrared light. Accordingly, whether discharge light having arisen from the first material M1 was transmitted through the second material M2 can be determined by determining at least one index value representing a feature of a waveform of a wavelength spectrum of discharge light transmitted through the second material M2 as determination information and estimating the index value or index values.

More specifically, at least one index value representing a feature of a waveform of a wavelength spectrum of transmitted light generated in a case where the spark S, which had inflammability if the spark S was discharged to space, arose from the first material M1 possibly included in the structural object O and thereby discharge light having arisen from the spark S was transmitted through the second material M2 can be stored as determination information in the storage 11. Then, the inflammability determination part 4B can determine that the spark S having arisen from the structural object O is nonflammable when intensity of discharge light detected by the photodetector 8 is determined to be of transmitted light having arisen from the first material M1 and transmitted through the second material M2, based on a degree of coincidence between at least one index value representing a feature of a waveform of a wavelength spectrum of the discharge light acquired based on the intensity of the discharge light detected by the photodetector 8 and the at least one index value representing the feature of the waveform of the wavelength spectrum of the transmitted light of the second material M2 included in the determination information.

The at least one index value representing the feature of the waveform of the wavelength spectrum of the transmitted light of the second material M2 can be defined and compared similarly to an index value representing the feature of a waveform of a wavelength spectrum of discharge light specific to the material Mx. The at least one index value representing the feature of the waveform of the wavelength spectrum of the transmitted light of the second material M2 can be determined based on discharge tests using the inflammable spark estimation system 1 as exemplified by FIG. 1 or FIG. 3 as well as simulations, literature values and the like.

When whether discharge light detected by the photodetector 8 was transmitted through the second material M2 is determined based on the at least one index value representing the feature of the waveform of the wavelength spectrum of the transmitted light of the second material M2, whether the discharge light detected by the photodetector 8 was transmitted through the second material M2 can be determined with high accuracy even when intensity change of discharge light is slight or variation in the intensity of the discharge light is large in each of the first to third specific wavelength bands λ1, λ2 and λ3 before and after transmission through the second material M2.

When the structural object O is an aircraft structural object, typical examples of the first material M1 overlapped with the second material M2 transparent to visible light include CFRP. Meanwhile, when the structural object O is an aircraft structural object, typical examples of the second material M2 transparent to visible light and overlapped with the first material M1 include GFRP and adhesive which transmits visible light. This is because the surface of CFRP is sometimes covered with GFRP partially for preventing corrosion. GFRP is sometimes stuck to the surface of CFRP with adhesive, such as epoxy resin.

When a thermal spark arises from CFRP whose surface has been covered with GFRP, only discharge light is transmitted through the GFRP. In this case, the discharge is internal discharge between the CFRP and the GFRP, and therefore the possibility of ignition is negligible even when the spark S has sufficient energy. Nevertheless, when the discharge light having the large energy is transmitted through the GFRP and then detected by the photodetector 8, a peak may appear in at least one of the first to third specific wavelength bands $\lambda 1$, $\lambda 2$ and $\lambda 3$ of a wavelength spectrum of the discharge light.

For that reason, at least one index value representing a feature of a waveform of a wavelength spectrum of transmitted light of the second material M2 consisting of at least one of GFRP and adhesive transmitting visible light can be stored in the storage 11. Thereby, estimating the index value or index values allow distinguishing discharge light transmitted through GFRP attached to CFRP with adhesive, from discharge light discharged from CFRP to space. Then, when the distinguished discharge light is transmitted light of GFRP, it can be determined that there is no possibility of ignition.

As long as discharge light is transmitted in a wavelength band specific to adhesive, such as epoxy resin, a peak or a low intensity band is observed in a wavelength spectrum of the transmitted light in the wavelength band specific to the adhesive. Therefore, when whether discharge light detected by the photodetector 8 is transmitted light of GFRP is determined by comparing at least one index value, representing a feature of a waveform of a wavelength spectrum of the discharge light detected by the photodetector 8, with at least one corresponding index value, representing a feature of a waveform of a wavelength spectrum of the transmitted light of the adhesive, whether the discharge light detected by the photodetector 8 is transmitted light of GFRP can be determined with high accuracy even when the thickness of the GFRP is not constant.

On the other hand, GFRP is transparent in the visible light region but opaque to light in the near infrared region. That is, when discharge light is transmitted through GFRP, the intensity of the transmitted light decreases remarkably in the near infrared region. For that reason, when intensity of near infrared light decreases remarkably in discharge light detected by the photodetector 8, it can be determined that the discharge is internal discharge which arose between CFRP and GFRP.

More specifically, an upper limit of at least one index value representing an intensity distribution of transmitted light of GFRP, such as the maximum of light intensity in the wavelength band of near infrared light, can be determined based on an intensity distribution in the wavelength band of near infrared light of transmitted light of GFRP. Then, the upper limit can be stored in the storage 11 as an index value representing a feature of a waveform of a wavelength spectrum of transmitted light of GFRP.

In this case, the inflammability determination part 4B can determine that the spark S having arisen from the structural object O has no inflammability when an index value representing an intensity distribution in the wavelength band of near infrared light of discharge light detected by the photodetector 8, obtained based on the intensity of the discharge light is not more than the upper limit of the index value representing an intensity distribution of transmitted light of GFRP, stored in the storage 11. That is, even when a peak is observed in at least one of the first to third specific wavelength bands $\lambda 1$, $\lambda 2$ and $\lambda 3$ of discharge light detected by the photodetector 8, it can be determined that the spark S has no possibility of ignition as long as a feature of a waveform represented by a wavelength spectrum of transmitted light of GFRP is observed.

Figure 5:
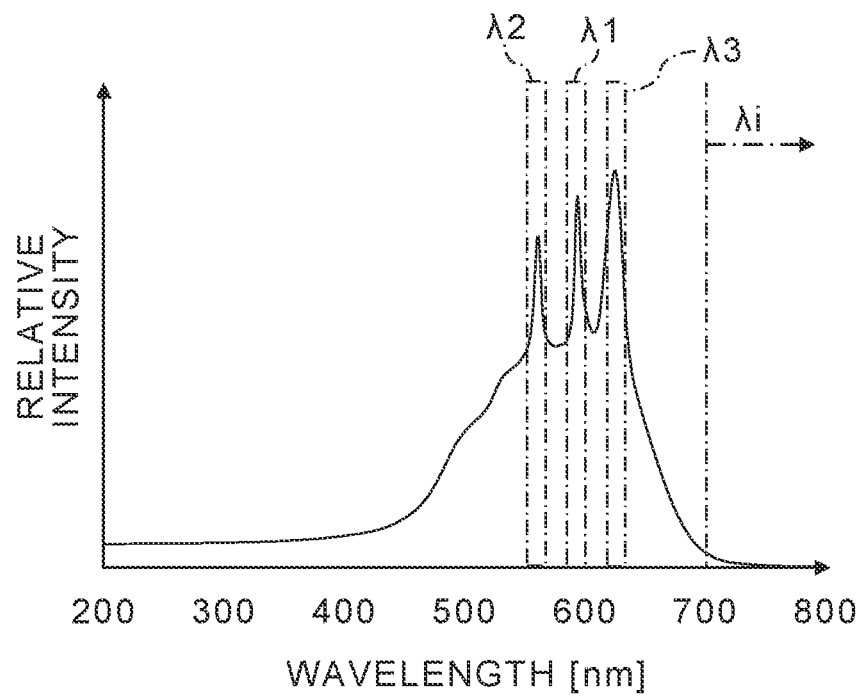
FIG. 5 shows an example of a wavelength spectrum of transmitted light when discharge light from a spark, which had arisen from CFRP, was transmitted through GFRP.

FIG. 5 shows an example of a wavelength spectrum of transmitted light when discharge light from a spark S, which had arisen from CFRP, was transmitted through GFRP.

In FIG. 5, the horizontal axis denotes the wavelength of transmitted light while the vertical axis denotes the relative intensity of the transmitted light. When discharge light from the spark S having arisen from CFRP was transmitted through GFRP, intensity of the transmitted light decreases remarkably within the wavelength band of about 700 nm to 2500 nm, which is the wavelength region $\lambda i$ of near infrared light, as exemplified by FIG. 5. Therefore, even when a peak appears in at least one of the first to third wavelength bands $\lambda 1$, $\lambda 2$ and $\lambda 3$ of a wavelength spectrum of the discharge light, it can be determined that the discharge light was transmitted through GFRP as long as the intensity decreases down to a value not more than the upper limit in the wavelength region $\lambda i$ of near infrared light. Accordingly, the inflammability determination part 4B can determine that the spark S has no inflammability.

Note that, an index value representing a feature of a waveform of a wavelength spectrum of transmitted light of GFRP may be set to an index value representing a positive or negative peak specific to GFRP instead of an index value representing a feature of a waveform in the wavelength band $\lambda i$ of near infrared light. In that case, when a peak specific to GFRP is observed in a wavelength spectrum of discharge light detected by the photodetector 8, it can be determined that the discharge is internal discharge having arisen inside the structural object O and therefore the spark S has no inflammability.

(Method of Estimating Inflammable Spark)

Next, a method of estimating an inflammable spark using the inflammable spark estimation system 1 will be described.

Figure 6:
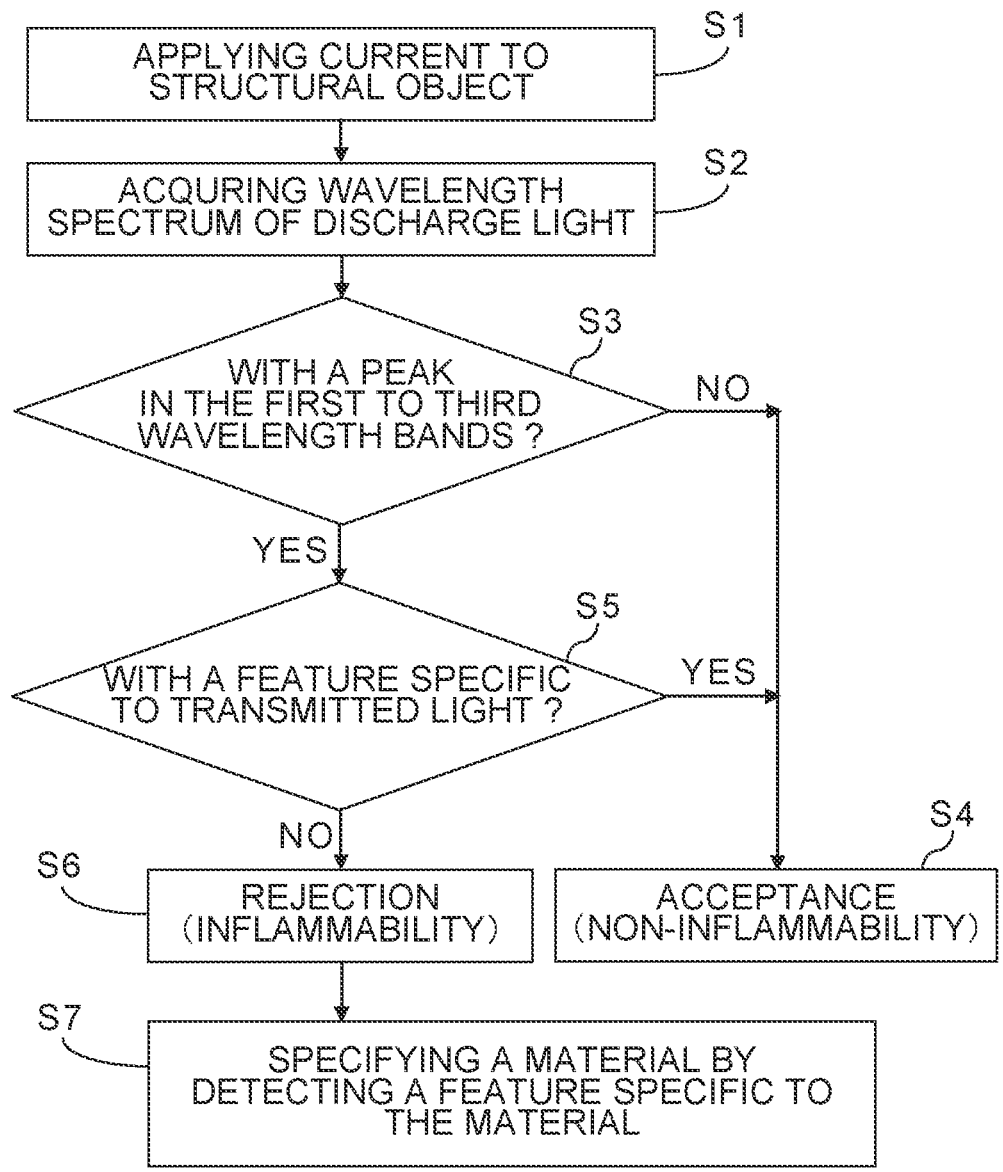
FIG. 6 is a flow chart showing an example of a processing flow for estimating inflammability of a spark, which arose from a structural object, using the inflammable spark estimation system shown in FIG. 1.

FIG. 6 is a flow chart showing an example of a processing flow for estimating inflammability of a spark S, which arose from a structural object O, using the inflammable spark estimation system 1 shown in FIG. 1.

Firstly, in step S1, current simulating lightning current or current generated due to static electricity is applied to the structural object O made of materials, such as the first material M1 and the second material M2, by the current application circuit 2 of the inflammable spark estimation system 1 exemplified by FIG. 1. Accordingly, the spark S arises depending on the structural object O.

When the spark S arises in the structural object O, intensity in each wavelength of discharge light arising due to the spark S is measured by the light intensity measuring system 3. Specifically, intensity in each wavelength of the discharge light dispersed by the spectroscope 7 is detected by the photodetector 8. The detected intensity of the discharge light in each wavelength is output to the data processing system 4 as a detection signal, such as an optical signal or an electric signal.

Next, in step S2, a wavelength spectrum of the discharge light is obtained by signal processing in the spectrum acquisition part 4A of the data processing system 4. The obtained wavelength spectrum of the discharge light is given to the inflammability determination part 4B.

Next, in step S3, the inflammability determination part 4B determines whether a peak exists in at least one of the first to third wavelength bands $\lambda 1$, $\lambda 2$ and $\lambda 3$ exemplified by FIG. 2, by peak detection processing of the wavelength spectrum of the discharge light. When any peak having intensity beyond the upper limit is not detected in any of the first to third wavelength bands $\lambda 1$, $\lambda 2$ and $\lambda 3$, it is determined that there are no peaks. In this case, it is determined that the spark S has no inflammability, in step S4. That is, it is determined that the structural object O has passed the discharge test.

On the contrary, when a peak is detected in at least one of the first to third wavelength bands λ1, λ2 and λ3, and it is determined that at least one peak exists, the inflammability determination part 4B determines whether the wavelength spectrum of the discharge light has a feature specific to transmitted light, in step S5.

As a concrete example, when a representative value, such as the maximum value, the average value or the integral value in the wavelength direction, of the intensity of the discharge light in the wavelength region λi of near infrared light has decreased down to a value not more than a threshold value or less than a threshold value as exemplified by FIG. 5, it can be determined that the discharge light generated by the spark S was transmitted through GFRP or the like. That is, when the first material M1 is CFRP while the second material M2 is GFRP in the example shown in FIG. 1, it can be determined that the discharge light of the spark S having arisen from the CFRP was transmitted through the GFRP.

When it is determined that the wavelength spectrum of the discharge light has the feature specific to the transmitted light, it is determined that the spark S has no inflammability, in step S4. That is, it is determined that the structural object O has passed the discharge test. Conversely, when it is determined that the wavelength spectrum of the discharge light does not have the feature specific to the transmitted light, it is determined that the spark S has inflammability, in step S6. That is, it is determined that the structural object O has failed the discharge test.

When it is determined that the spark S having arisen from the structural object O has inflammability, the material specifying part 4C can specify a material from which the spark S arose, in step S7. Specifically, it can be determined from which material out of the materials, such as the first material M1 and the second material M2, included in the structural object O the spark S having arisen from the structural object O arose.

In that case, a discharge test is carried out for each material Mx, which can be included in the structural object O, as exemplified by FIG. 3 in advance of a discharge test of the structural object O as exemplified by FIG. 1. Then, waveforms of wavelength spectra of discharge light corresponding to respective materials Mx can be displayed on the display 10, for example. Thereby, a user can grasp the features of the waveforms of wavelength spectra specific to the materials Mx respectively.

Then, index values respectively representing the features of the waveforms of the wavelength spectra of the discharge light specific to the materials Mx possibly included in the structural object O can be set as determination information for specifying the material Mx from which the spark S arose, by inputting necessary information into the determination information setting part 4D by operating the input device 9. The set determination information can be stored in the storage 11.

As a concrete example, when a peak appears at a wavelength λmx specific to a material Mx in a wavelength spectrum of discharge light as exemplified by FIG. 4, the wavelength λmx specific to the material Mx and a threshold value, such as a lower limit, of the peak intensity can be related to identification data on the material Mx and stored as determination information in the storage 11.

Thereby, the material Mx from which the spark S arose can be specified in the material specifying part 4C by comparing the feature of the waveform of the wavelength spectrum of the discharge light, having arisen from the spark S determined to have inflammability, to the determination information stored in the storage 11. That is, which material the spark S arose from can be specified when the structural object O is made of the first material M1 and the second material M2 as exemplified by FIG. 1, for example, as well as when the structural object O is made of not less than three materials.

(Effects)

The above-mentioned inflammable spark estimation system 1 and method of estimating an inflammable spark can not only determine inflammability of the spark S but specify a material from which the spark S arose, by acquiring a wavelength spectrum of discharge light having arisen from the spark S as well as detecting a feature of the wavelength spectrum. In addition, when discharge light from the spark S was transmitted through a transparent object, it can be detected that the discharge light is transmitted light and therefore the spark S has no inflammability.

Therefore, according to the inflammable spark estimation system 1 and the method of estimating an inflammable spark, a part from which an observable inflammable spark S arose can be specified promptly in a case where the structural object O are made of a plurality of materials. As a result, a part or a component of the structural object O whose design should be changed to prevent an inflammable spark S from arising can be determined promptly. In addition, internal discharge by which only discharge light is transmitted outside the structural object O can be detected so that incorrect detection that a non-flammable spark S is determined as inflammable can be avoided.

(Other Implementations)

While certain implementations have been described, these implementations have been presented by way of example only, and are not intended to limit the scope of the invention. Indeed, the novel methods and systems described herein may be embodied in a variety of other forms; furthermore, various omissions, substitutions and changes in the form of the methods and systems described herein may be made without departing from the spirit of the invention. The accompanying claims and their equivalents are intended to cover such forms or modifications as would fall within the scope and spirit of the invention.

For example, discharge light in a necessary wavelength band may be extracted by a wavelength filter to be detected by the photodetector 8 although a configuration that discharge light at each wavelength dispersed by the spectroscope 7 is detected by the photodetector 8 has been explained in the above-mentioned example.

What is claimed is:

1. An inflammable spark estimation system comprising:
a photodetector for measuring intensity of discharge light generated from a spark occurring in a structural object made of a plurality of materials; and
data processing circuitry configured to:
determine a wavelength spectrum based on the measured intensity of the discharge light generated from the spark;
determine whether the spark has inflammability based on comparing a waveform of the determined wavelength spectrum with determination information including waveforms of wavelength spectra of predetermined discharge light of predetermined inflammable sparks respectively associated with the plurality of materials; and determine, using the determined wavelength spectrum, which of the plurality of the materials the spark has occurred based on determining that the spark has the inflammability, wherein the determination information includes i) at least one upper limit of intensity of the predetermined discharge light in at least one specific wavelength band, and ii) index values representing the waveforms of the wavelength spectra of the predetermined discharge light of the predetermined inflammable sparks associated with the plurality of materials, wherein the data processing circuitry is configured to determine that the spark has the inflammability based on the measured intensity of the discharge light being beyond the at least one upper limit in the at least one specific wavelength band, wherein the data processing circuitry is configured to determine which of the plurality of the materials the spark has occurred from, based on a degree of coincidence between i) an index value representing a feature of the waveform of the wavelength spectrum of the discharge light and ii) each of the index values included in the determination information, wherein the materials include a first material and a second material, wherein the predetermined inflammable sparks include a first predetermined inflammable spark associated with the first material, and wherein the at least one upper limit is determined to a value larger than attenuated intensity of transmitted light in the at least one specific wavelength band, the transmitted light being a first predetermined discharge light of the first predetermined inflammable spark transmitted through the second material with intensity attenuation, the value of the at least one upper limit being smaller than unattenuated intensity of the predetermined discharge light, before the intensity attenuation due to transmission of the predetermined discharge light through the second material, in the at least one specific wavelength band.

2. The inflammable spark estimation system according to claim 1,
wherein the first material is carbon fiber reinforced plastic while the second material is at least one of glass fiber reinforced plastic and adhesive transmitting visible light.

3. A method of estimating an inflammable spark comprising:
determining whether the spark has the inflammability, using the inflammable spark estimation system according to claim 2; and
determining which of the plurality of the materials the spark has occurred from when the spark has been determined to have the inflammability.

4. The inflammable spark estimation system according to claim 1, further comprising:
a spectroscope for inputting and dispersing the discharge light,
wherein the photodetector is configured to measure intensity of the discharge light dispersed by the spectroscope.

5. A method of estimating an inflammable spark comprising:
determining whether the spark has the inflammability, using the inflammable spark estimation system according to claim 4; and
determining which of the plurality of the materials the spark has occurred from when the spark has been determined to have the inflammability.

6. A method of estimating an inflammable spark comprising:
determining whether the spark has the inflammability, using the inflammable spark estimation system according to claim 1; and
determining which of the plurality of the materials the spark has generated from when the spark has been determined to have the inflammability.

7. An inflammable spark estimation system comprising:
a photodetector for measuring intensity of discharge light generated from a spark occurring in a structural object made of a plurality of materials; and
data processing circuitry configured to:
determine a wavelength spectrum based on the measured intensity of the discharge light generated from the spark;
determine whether the spark has inflammability based on comparing a waveform of the determined wavelength spectrum with determination information including waveforms of wavelength spectra of predetermined discharge light of predetermined inflammable sparks respectively associated with the plurality of materials; and
determine, using the determined wavelength spectrum, which of the plurality of the materials the spark has occurred based on determining that the spark has the inflammability,
wherein the plurality of the materials include a first material and a second material,
the predetermined inflammable sparks includes a first predetermined inflammable spark associated with the first material,
the determination information includes an index value representing a waveform of a wavelength spectrum of transmitted light which is a first predetermined discharge light having of the first predetermined inflammable spark transmitted through the second material, and
the data processing circuitry is configured to determine that the spark has no inflammability when the intensity of the discharge light measured by the photodetector is determined to be intensity of transmitted light, which is a certain discharge light having generated from the first material and having been transmitted through the second material, based on a degree of coincidence between the index value included in the determination information and an index value, representing a waveform of a wavelength spectrum of the discharge light measured by the photodetector, obtained based on the intensity of the discharge light measured by the photodetector.

8. The inflammable spark estimation system according to claim 7,
wherein the index value representing the waveform of the wavelength spectrum of the transmitted light of the first predetermined discharge light is an upper limit of an index value representing an intensity distribution of the transmitted light of the first predetermined discharge light, which has been transmitted through glass fiber reinforced plastic, in a wavelength band of near-infrared light, the upper limit of the index value being determined based on the intensity distribution, and
the data processing circuitry is configured to determine that the spark has no inflammability when an index value, representing an intensity distribution of the discharge light measured by the photodetector in the wavelength band of the near-infrared light, obtained based on the intensity of the discharge light measured by the photodetector is not more than the upper limit.

9. A method of estimating an inflammable spark comprising:
determining whether the spark has the inflammability, using the inflammable spark estimation system according to claim 8; and
determining which of the plurality of the materials the spark has arisen occurred from when the spark has been determined to have the inflammability.

10. The inflammable spark estimation system according to claim 7, wherein the first material is carbon fiber reinforced plastic while the second material is at least one of glass fiber reinforced plastic and adhesive transmitting visible light.

11. A method of estimating an inflammable spark comprising:
determining whether the spark has the inflammability, using the inflammable spark estimation system according to claim 7; and
determining which of the plurality of the materials the spark has occurred from when the spark has been determined to have the inflammability.

12. The inflammable spark estimation system according to claim 7,
wherein the determination information includes i) at least one upper limit of intensity of the predetermined discharge light in at least one specific wavelength band, and ii) index values representing the waveforms of the wavelength spectra of the predetermined discharge light of the predetermined inflammable sparks associated with the plurality of materials,
the data processing circuitry is configured to determine that the spark has the inflammability based on the measured intensity of the discharge light being beyond the at least one upper limit in the at least one specific wavelength band, and
the data processing circuitry is configured to determine which of the plurality of the materials the spark has occurred from, based on a degree of coincidence between i) an index value representing a feature of the waveform of the wavelength spectrum of the discharge light and ii) each of the index values included in the determination information.

13. The inflammable spark estimation system according to claim 12,
wherein the materials include a first material and a second material,
the predetermined inflammable sparks include a first predetermined inflammable spark associated with the first material, and
the at least one upper limit is determined to a value larger than attenuated intensity of transmitted light in the at least one specific wavelength band, the transmitted light being a first predetermined discharge light of the first predetermined inflammable spark transmitted through the second material with intensity attenuation, the value of the at least one upper limit being smaller than unattenuated intensity of the predetermined discharge light, before the intensity attenuation due to transmission of the predetermined discharge light through the second material, in the at least one specific wavelength band.

14. The inflammable spark estimation system according to claim 13,
wherein the first material is carbon fiber reinforced plastic while the second material is at least one of glass fiber reinforced plastic and adhesive transmitting visible light.

15. The inflammable spark estimation system according to claim 12,
wherein the plurality of the materials include a first material and a second material,
the predetermined inflammable sparks include a first predetermined spark associated with the first material, the first predetermined spark being inflammable,
the determination information includes an index value representing a waveform of a wavelength spectrum of transmitted light which is a first predetermined discharge light associated with the first predetermined spark transmitted through the second material, and
the data processing circuitry is configured to determine that the spark has no inflammability when the intensity of the discharge light measured by the photodetector is determined to be intensity of transmitted light, which is a certain discharge light having generated from the first material and having been transmitted through the second material, based on a degree of coincidence between the index value included in the determination information and an index value, representing a feature of a waveform of a wavelength spectrum of the discharge light measured by the photodetector, obtained based on the intensity of the discharge light measured by the photodetector.

16. The inflammable spark estimation system according to claim 15,
wherein the first material is carbon fiber reinforced plastic while the second material is at least one of glass fiber reinforced plastic and adhesive transmitting visible light.

17. The inflammable spark estimation system according to claim 12, further comprising:
a spectroscope for inputting and dispersing the discharge light,
wherein the photodetector is configured to measure intensity of the discharge light dispersed by the spectroscope.

18. The inflammable spark estimation system according to claim 7, further comprising:
a spectroscope for inputting and dispersing the discharge light,
wherein the photodetector is configured to measure intensity of the discharge light dispersed by the spectroscope.

19. A method of estimating an inflammable spark comprising:
determining whether the spark has the inflammability, using the inflammable spark estimation system according to claim 4; and
determining which of the plurality of the materials the spark has generated from when the spark has been determined to have the inflammability.

20. A method of estimating an inflammable spark comprising:
measuring intensity of discharge light generated from a spark occurring in a structural object made of a plurality of materials, by a photodetector;
determining a wavelength spectrum based on the measured intensity of the discharge light generated from the spark;
determining whether the spark has inflammability based on comparing a waveform of the determined wavelength spectrum with determination information including, waveforms of wavelength spectra of predetermined discharge light of predetermined inflammable sparks respectively associated with the plurality of the materials; and determining which of the plurality of the materials the spark has generated from based on determining the spark has the inflammability, wherein the determination information includes i) at least one upper limit of intensity of the predetermined discharge light in at least one specific wavelength band, and ii) index values representing the waveforms of the wavelength spectra of the predetermined discharge light of the predetermined inflammable sparks associated with the plurality of materials, wherein the spark is determined to have the inflammability based on the measured intensity of the discharge light being beyond the at least one upper limit in the at least one specific wavelength band, wherein which of the plurality of the materials the spark has occurred from is determined based on a degree of coincidence between i) an index value representing a feature of the waveform of the wavelength spectrum of the discharge light and ii) each of the index values included in the determination information, wherein the materials include a first material and a second material, wherein the predetermined inflammable sparks include a first predetermined inflammable spark associated with the first material, and wherein the at least one upper limit is determined to a value larger than attenuated intensity of transmitted light in the at least one specific wavelength band, the transmitted light being a first predetermined discharge light of the first predetermined inflammable spark transmitted through the second material with intensity attenuation, the value of the at least one upper limit being smaller than unattenuated intensity of the predetermined discharge light, before the intensity attenuation due to transmission of the predetermined discharge light through the second material, in the at least one specific wavelength band.

\* \* \* \* \*